United States Patent
Kuan et al.

(10) Patent No.: US 10,389,344 B2
(45) Date of Patent: Aug. 20, 2019

(54) VOLTAGE SUPPLY CIRCUITS AND CONTROLLING METHODS THEREFOR

(71) Applicant: MediaTek Inc., Hsin-Chu (TW)

(72) Inventors: Chien-Wei Kuan, Hsinchu (TW); Yen-Hsun Hsu, Hengshan Township, Hsinchu County (TW); Tun-Shih Chen, Linluo Township, Pingtung County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/038,588

(22) PCT Filed: Jan. 14, 2015

(86) PCT No.: PCT/CN2015/070684
§ 371 (c)(1),
(2) Date: May 23, 2016

(87) PCT Pub. No.: WO2015/106686
PCT Pub. Date: Jul. 23, 2015

(65) Prior Publication Data
US 2016/0294376 A1    Oct. 6, 2016

Related U.S. Application Data

(60) Provisional application No. 61/927,155, filed on Jan. 14, 2014.

(51) Int. Cl.
*G05F 1/46* (2006.01)
*G05F 1/00* (2006.01)
(Continued)

(52) U.S. Cl.
CPC ........ *H03K 17/005* (2013.01); *H02M 3/1584* (2013.01); *H02M 2001/0032* (2013.01);
(Continued)

(58) Field of Classification Search
CPC .............. H03K 17/005; H02M 3/1584; H02M 2001/0032; H02M 2001/0048; Y02B 70/1491; Y02B 70/16
(Continued)

(56) References Cited

U.S. PATENT DOCUMENTS

| 8,242,759 | B2 | 8/2012 | Carroll et al. |
| 8,432,713 | B2 | 4/2013 | Popescu et al. |

(Continued)

FOREIGN PATENT DOCUMENTS

| CN | 102447390 | 5/2012 |
| CN | 102804576 A | 11/2012 |

OTHER PUBLICATIONS

International Search Report dated Apr. 16, 2016, issued in application No. PCT/CN2015/070684.
(Continued)

*Primary Examiner* — Brandon S Cole
(74) *Attorney, Agent, or Firm* — Wolf, Greenfield & Sacks, P.C.

(57) ABSTRACT

A voltage supply circuit is provided. The voltage supply circuit is capable of operating at a first mode and generates a loading current at an output node. The voltage supply circuit includes a plurality of inductors and a plurality of drier circuits. The plurality of inductors are coupled to the output node. Each inductor has an inductance value. The plurality driver circuits are coupled to the plurality of inductors respectively. The inductance value of a first inductor among the plurality of inductors is greater than the inductance values of the other inductor.

9 Claims, 4 Drawing Sheets

(51) Int. Cl.
*G05F 1/26* (2006.01)
*G05F 1/635* (2006.01)
*H02M 3/158* (2006.01)
*H03K 17/00* (2006.01)
*H02M 1/00* (2006.01)

(52) U.S. Cl.
CPC .. *H02M 2001/0048* (2013.01); *Y02B 70/1491* (2013.01); *Y02B 70/16* (2013.01)

(58) Field of Classification Search
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 2004/0196019 A1* | 10/2004 | Schneider | H02M 3/1584 323/285 |
| 2005/0093525 A1* | 5/2005 | Walters | H02M 3/1584 323/272 |
| 2007/0024360 A1 | 2/2007 | Markowski | |
| 2008/0129259 A1* | 6/2008 | Endo | H02M 3/1584 323/271 |
| 2008/0303495 A1* | 12/2008 | Wei | H02M 3/156 323/272 |
| 2010/0026261 A1* | 2/2010 | Candage | H02M 3/1584 323/283 |
| 2011/0169471 A1* | 7/2011 | Nagasawa | H02M 3/1584 323/283 |
| 2011/0169476 A1 | 7/2011 | Ikriannikov et al. | |
| 2012/0313614 A1 | 12/2012 | Ohshita et al. | |
| 2013/0027009 A1* | 1/2013 | Tang | H02M 3/1584 323/271 |
| 2013/0049712 A1* | 2/2013 | Ueno | H02M 3/1584 323/234 |
| 2013/0214751 A1* | 8/2013 | Shiraishi | G05F 1/46 323/272 |
| 2013/0293207 A1* | 11/2013 | Wei | G05F 1/46 323/272 |
| 2014/0049240 A1* | 2/2014 | Chen | G05F 1/10 323/282 |
| 2014/0082377 A1* | 3/2014 | Dinh | G06F 1/26 713/300 |
| 2015/0097542 A1 | 4/2015 | Repton et al. | |
| 2018/0205371 A1 | 7/2018 | Li et al. | |

OTHER PUBLICATIONS 15737234.3, Nov. 28, 2016, Extended European Search Report.
Extended European Search Report for Application No. EP 15737234.3 dated Nov. 28, 2016.
Jia et al., Two-stage voltage regulator for laptop computer CPUs and the corresponding advanced control schemes to improve light-light performance. IEEE Applied Power Electronics Conference and Exposition. 2004;(2):1294-1300.
Written Opinion dated Apr. 16, 2015 in connection with International Application No. PCT/CN2015/070684.
International Preliminary Report on Patentability and English translation thereof dated Jul. 28, 2016 in connection with International Application No. PCT/CN2015/070684.
U.S. Appl. No. 15/921,513, filed Mar. 14, 2018, Li et al.

\* cited by examiner

| Mode | IL | The number of inductors |
|------|----|------|
| M20 | IL < VTH1 | 1 (11A) |
| M21 | VTH1 < IL < VTH2 | 2 (11A-11B) |
| M22 | VTH2 < IL < VTH3 | 3 (11A-11C) |
| M23 | VTH3 < IL | 4 (11A-11D) |

FIG. 2

VOLTAGE SUPPLY CIRCUITS AND CONTROLLING METHODS THEREFOR

CROSS REFERENCE TO RELATED APPLICATIONS

This Application is a National Stage of International Patent Application Serial No. PCT/CN2015/070684, filed Jan. 14, 2015, entitled "VOLTAGE SUPPLY CIRCUITS AND CONTROLLING METHODS THEREFOR," which claims the benefit of U.S. Provisional Application No. 61/927,155, filed on Jan. 14, 2014, the contents of which are incorporated herein by reference.

BACKGROUND OF THE INVENTION

Field of the Invention

The invention relates to a voltage supply circuit, and more particularly, to a multi-phase voltage supply circuit with enhanced efficiency in less-loading states.

Description of the Related Art

In a multi-phase voltage supplier, there are several inductors coupled to an output node of the voltage supplier. The number of inductors is determined according to the loading of the voltage supplier. However, one factor of the power loss of the voltage supplier is the resistance values of the inductors. There are two different types of resistance values for one inductor: an AC resistance (ACR) and a DC resistance (DCR). Thus, in a multi-phase voltage supplier, how to set inductance values of inductors appropriately for enhanced efficiency is an important issue.

BRIEF SUMMARY OF THE INVENTION

Thus, it is desirable to provide a voltage supply circuit which enhanced efficiency by enabling different inductors in different loading states.

An exemplary embodiment of a voltage supply circuit is provided. The voltage supply circuit is capable of operating at a first mode and generates a loading current at an output node. The voltage supply circuit comprises a plurality of inductors and a plurality of drier circuits. The plurality of inductors are coupled to the output node. Each inductor has an inductance value. The plurality driver circuits are coupled to the plurality of inductors respectively. The inductance value of a first inductor among the plurality of inductors is greater than the inductance values of the other inductor.

In an embodiment, for each driver circuit, when the driver circuit is enabled, the driver circuit generates a driving voltage to the corresponding inductor. Among the plurality of driver circuits, a first driver circuit is coupled to the first inductor. When the voltage supply circuit operates at the first mode, only the first driver circuit is enabled to generate the driving voltage to the first inductor.

In another embodiment, when the voltage supply circuit operates at a second mode, at least two driver circuits of the plurality of driver circuits are enabled to generate driving voltages to the corresponding inductors.

Another exemplary embodiment of a controlling method for a voltage supply circuit is provided. The voltage supply circuit generates a loading current at an output node of the voltage supply circuit. The voltage supply circuit comprises a plurality of inductors coupled to the output node. The controlling method comprises steps of when a value of the loading current is less than a first threshold, controlling the voltage supply circuit to generate a first driving voltage to a first inductor among the plurality of inductors; and when the value of the loading current is greater than the first threshold and less than a second threshold, controlling the voltage supply circuit to generate the first driving voltage to the first inductor and generate a second driving voltage to a second inductor among the plurality of inductors. An inductance value of the first inductor is greater than an inductance value of the second inductor.

In an embodiment, the controlling method further comprises when the value of the loading current is greater than the second threshold and less than a third threshold, controlling the voltage supply circuit to generate the first driving voltage to the first inductor, generate the second driving voltage to the second inductor, and generate a third driving voltage to a third inductor among the plurality of inductors. The inductance value of the first inductor is greater than an inductance value of the third inductor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 shows relationship between the number of valid inductors and the different modes at which the voltage supply circuit in FIG. 1 operates by depending on a loading current;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
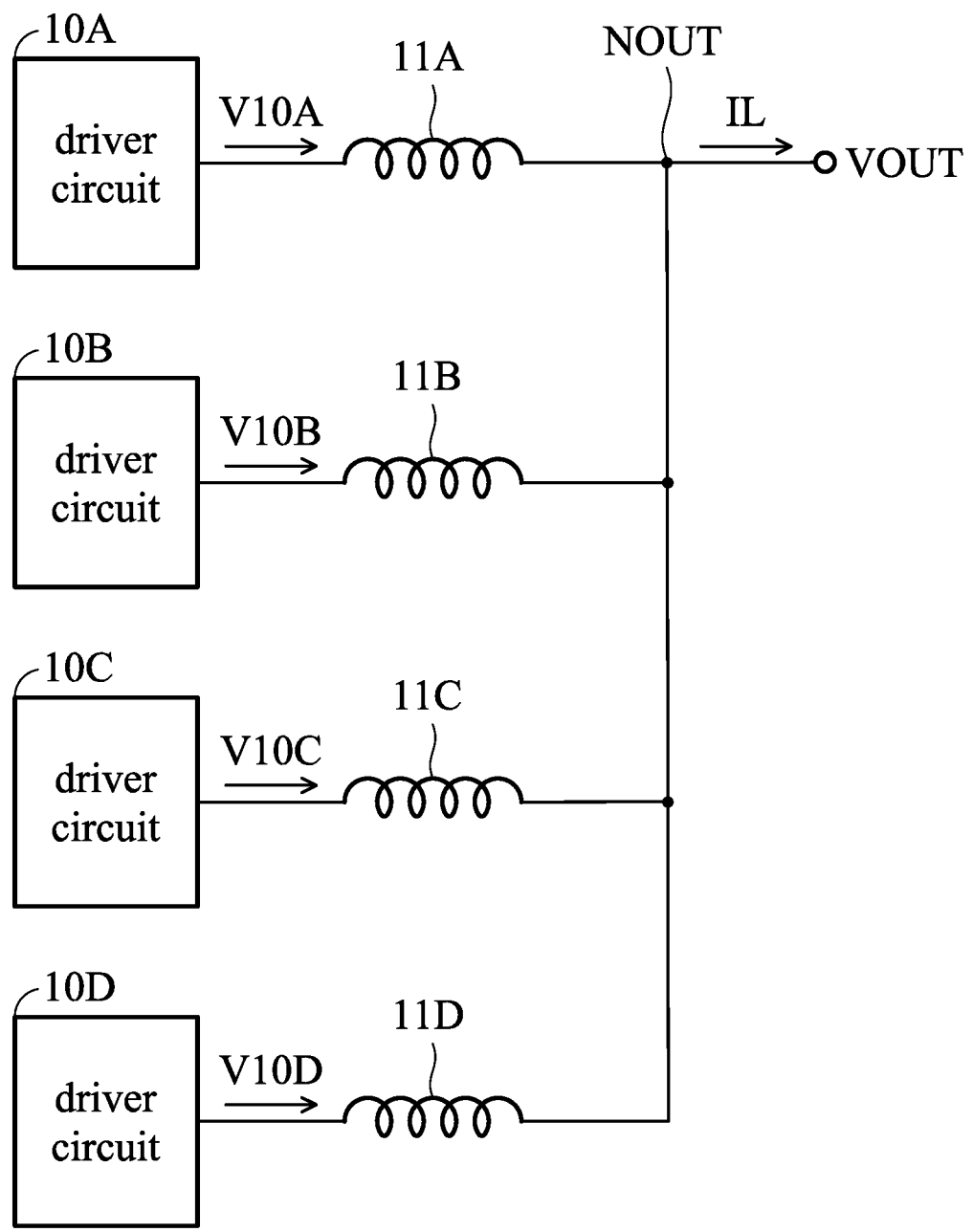
FIG. 1 shows an exemplary embodiment of a voltage supply circuit.

In an exemplary embodiment of voltage supply circuit as shown in FIG. 1, a voltage supply circuit 1 comprises a plurality of driver circuits 10 and a plurality of inductors 11. In the embodiment, there are four driver circuits 10A-10D and four inductors 11A-11D for an example. Referring to FIG. 1, the driver circuits 10A-10D are coupled to the inductors 11A-11D respectively, and all the inductors 11A-11D are coupled to an output node NOUT of the voltage supply circuit 1. According to the structure of the voltage supply circuit 1, there are four paths for providing an output voltage VOUT/loading current IL to the output node NOUT, and the four paths operate in four different phases respectively. Thus, the voltage supply circuit 1 is referred to as a multi-phase voltage suppler circuit.

Each driver circuit generates a driving voltage to the corresponding inductor when the driver circuit is enabled. The situation where an inductor receives a driving voltage indicates that the inductor is valid. In the embodiment, the number of driver circuits being enabled at the same time is determined according to the loading current IL which is related to the loading state of the voltage supply circuit 1. The loading current IL is proportional to the loading state of the voltage supply circuit 1. In other words, the number of valid inductors is determined according to the loading current IL. When an inductor receives a corresponding driving voltage, an inductor current is generated. FIG. 2 shows relationship between the number of valid inductors and the different modes at which the voltage supply circuit 1 operates in different loading current IL. Referring to FIG. 2, in order to make the voltage supply circuit 1 to operate at different modes, three thresholds VTH1-VTH3 are available for the loading current IL, wherein VTH1<VTH2<VTH3. When the loading current IL is smaller than the threshold VTH1 (first mode M20), the number of valid inductors is equal to one (such as the inductor 11A). That is, only one driver circuit among the driver circuit 10A-10D is enabled to generate a driving voltage V10A to the corresponding inductor 11A. When the loading current IL is smaller than the threshold VTH2 and larger than the threshold VTH1 (second mode M21), the number of valid inductors is equal to two (such as the inductors 11A and 11B). That is, two driver circuits among the driver circuit 10A-10D are enabled to generate driving voltages V10A and V10B to the corresponding inductors 11A and 11B respectively. When the loading current IL is smaller than the threshold VTH3 and larger than the threshold VTH2 (third mode M22), the number of valid inductor is equal to three (such as the inductors 11A-11C). That is, three driver circuits among the driver circuit 10A-10D are enabled to generate driving voltages V10A-V10C to the corresponding inductors 11A-11C respectively. When the loading current IL is larger than the threshold VTH3 (fourth mode M23), the number of valid inductor is equal to four (such as the inductors 11A-11D). That is, all of the driver circuits 10A-10D are enabled to generate driving voltages V10A-V10D to the corresponding inductors 11A-11D respectively.

Each of the inductors 11A-11D has two different resistance values: an AC resistance (ACR) value and a DC resistance (DCR) value. Both of the resistance values influence the efficiency of the voltage supply circuit 1. For each inductor, when the loading of the voltage supply circuit 1 is small (that is the loading current is small), the power loss induced by the ACR value of the inductor dominates the power loss of the voltage supply circuit 1. In this case, the inductor may have a great inductance value to decrease the ripple on the inductor current flowing through the inductor, thereby getting higher efficiency for the voltage supply circuit. In another case, when the loading is great (that is the loading current is larger), the power loss induced by the DCR value of the inductor dominates the power loss. At this time, the inductor may have a less inductance value to decrease the average value of the inductor current flowing through the inductor, thereby getting higher efficiency for the voltage supply circuit. Thus, in the voltage supply circuit 1 of the embodiment, the inductors 11A-11D are set to specific inductance values for enhanced efficiency.

According to the above description, when the loading current IL is small, only the inductor 11A is valid. For enhancing the efficiency, the inductance value of the inductor 11A is greater than the inductance values of the other inductors 11B-11D, and, thus the power loss induced by the ACR value of the inductor 11A is decreased. When the loading current IL is smaller than the threshold VTH1, the inductor 11A having greater inductance value is valid for enhancing the efficiency. When the loading current IL is larger than the threshold VTH1, most of the inductors 11A-11D (excluding the inductor 11A) have less inductance values, and, thus, the power loss induced by the DCR values of the inductors is decreased, thereby enhancing the efficiency. In this case, since at least two inductors are valid, the loading current IL obtained from the inductor current flowing through the at least two inductors is sufficient for the loading.

Figure 3:
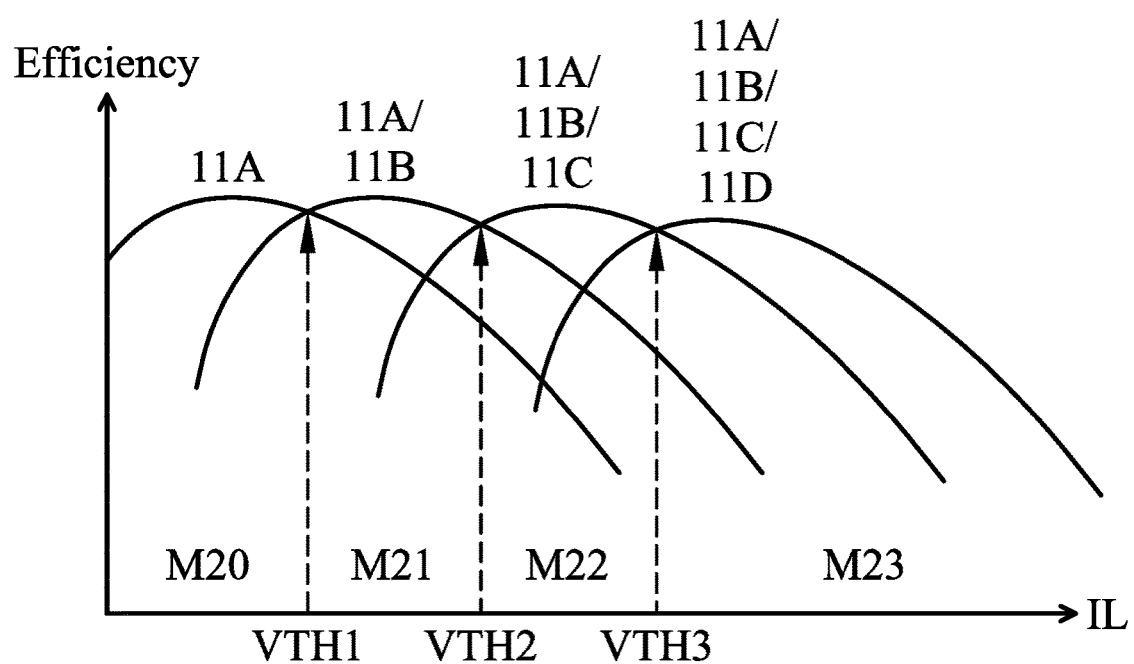
FIG. 3 shows an exemplary embodiment of a curve of relationship between efficiency and a loading current of the voltage supply circuit of FIG. 1.

FIG. 3 shows an exemplary embodiment of a curve of relationship between the efficiency and the loading current IL. As shown in FIG. 3, through the unbalanced inductance values of the inductors 11A-11D, the voltage supply circuit 1 has enhanced efficiency at the mode M20-M23.

Figure 4:
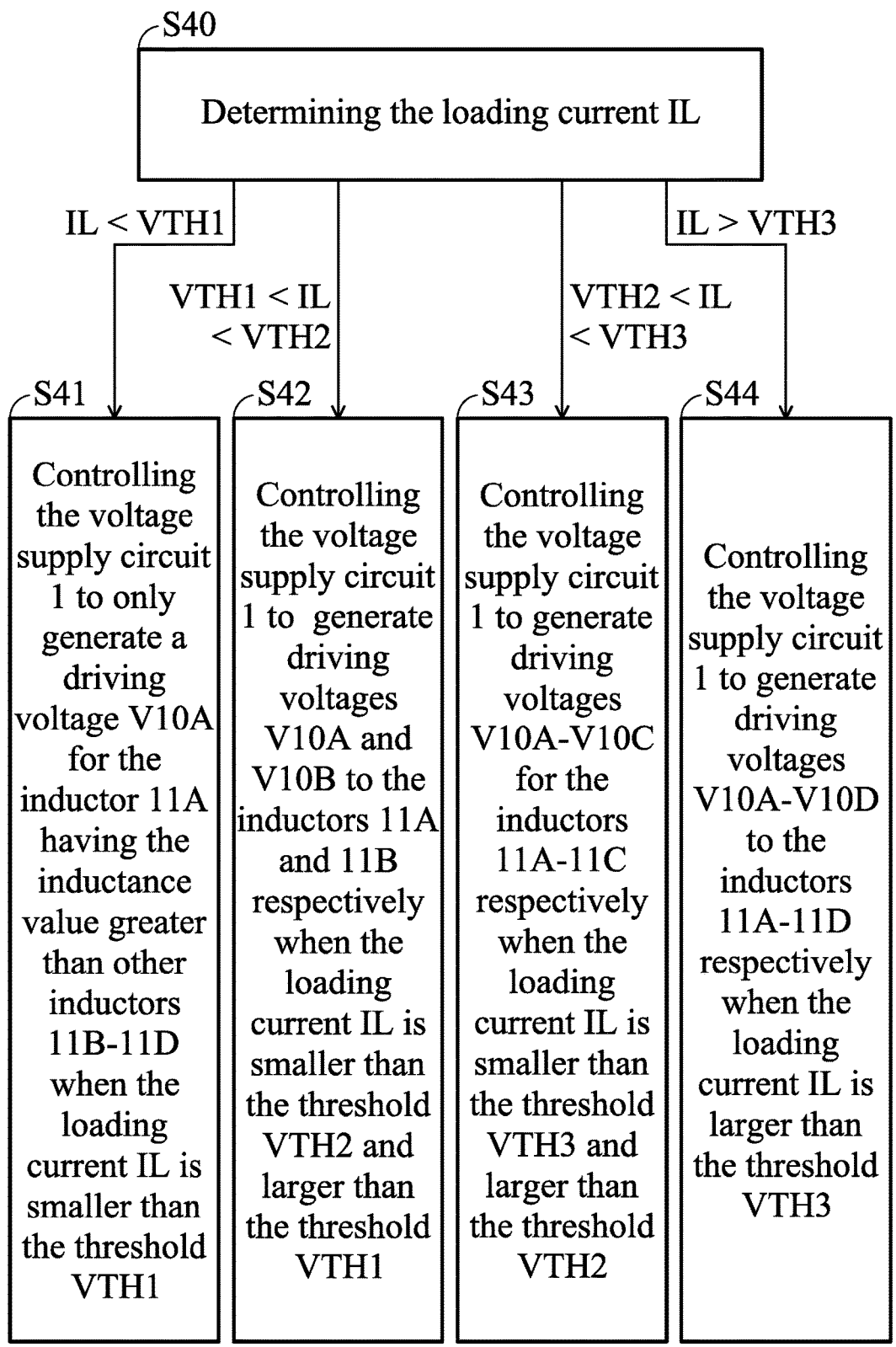
FIG. 4 shows an exemplary embodiment of a controlling method.

FIG. 4 shows an exemplary embodiment of a controlling method. In the following, the controlling method will be described by referring to FIGS. 1, 2, and 4. First, the loading state of the voltage supply circuit 1 is obtained by determining the loading current IL (step S40). When it is determined that the loading current IL is smaller than the threshold VTH1, the voltage supply circuit 1 enters the first mode M20, and the voltage supply circuit 1 is controlled to only enable the driver circuit 10A to generate a driving voltage V10A for the inductor 11A having the inductance value greater than other inductors 11B-11D (step S41). When it is determined that the loading current IL is smaller than the threshold VTH2 and larger than the threshold VTH1, the voltage supply circuit 1 enters the second mode M21, and the voltage supply circuit 1 is controlled to enable the driver circuits 10A and 10B to generate driving voltages V10A and V10B to the inductors 11A and 11B respectively (step S42).

When it is determined that the loading current IL is smaller than the threshold VTH3 and larger than the threshold VTH2, the voltage supply circuit 1 enters the third mode M22, and the voltage supply circuit 1 is controlled to enable the driver circuits 10A-10V to generate driving voltages V10A-V10C for the inductors 11A-11C respectively (step S43). When it is determined that the loading current IL is larger than the threshold VTH3, the voltage supply circuit 1 enters the fourth mode M23, and the voltage supply circuit 1 is controlled to enable all of the driver circuits 10A-10D to generate driving voltages V10A-V10D to the inductors 11A-11D respectively (step S44).

According to the embodiment of the controlling method, when the loading of the voltage supply circuit 1 is less, the inductor which has the greater inductance value is valid, which can decrease power loss and thus enhance efficiency of the voltage supply circuit 1 due to decrement of the power loss induced by the ACR value. When the loading of the voltage supply circuit 1 current IL is greater, most of the valid inductors have less inductance values, which can decrease power loss and thus enhance efficiency of the voltage supply circuit 1 due to decrement of the power loss induced by the DCR values of the valid inductors. Thus, the voltage supply circuit 1 has better efficiency at each of the modes M20-M23.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A voltage supply circuit for generating a loading current at an output node, the voltage supply circuit comprising:
a plurality of inductors coupled to the output node, each having an inductance value, the plurality of inductors comprising a first inductor having an inductance value greater than at least one of the other inductors of the plurality of inductors; and a plurality of driver circuits, coupled to the plurality of inductors, respectively, the plurality of driver circuits comprising a first driver circuit having a same configuration as another driver circuit of the plurality of driver circuits, wherein:

when the loading current has a non-zero magnitude, the first driver circuit of the plurality of driver circuits is enabled to drive the first inductor, all other driver circuit of the plurality of driver circuits are not enabled, and the load is not driven until the loading current is at least as high as a loading current for which the first driver circuit is enabled, when the loading current is higher than a first threshold, a second driver circuit of the plurality of driver circuits is enabled to drive a second inductor of the plurality of inductors, the first driver circuit is enabled to drive the first inductor, and the first and second driver circuits operate in different phases, and when the loading current is higher than a second threshold, a third driver circuit of the plurality of driver circuits is enabled to drive a third inductor of the plurality of inductors, the second driver circuit is enabled to drive the second inductor, the first driver circuit is enabled to drive the first inductor, and the first, second and third driver circuits operate in different phases.

2. The voltage supply circuit as claimed in claim 1, wherein each driver circuit of the plurality of driver circuits generates a driving voltage to drive a corresponding inductor of the plurality of inductors.

3. The voltage supply circuit as claimed in claim 2, wherein when the loading current is higher than the first threshold, at least two driver circuits of the plurality of driver circuits are enabled to generate driving voltages to drive their corresponding inductors.

4. The voltage supply circuit as claimed in claim 3, wherein the at least two driver circuits comprise the first and second driver circuits.

5. The voltage supply circuit as claimed in claim 2, wherein when the loading current is less than the first threshold, the first driver circuit of the plurality of driver circuits is enabled to drive the first inductor.

6. The voltage supply circuit as claimed in claim 1, wherein the inductance values of the plurality of inductors excluding the first inductor are equal.

7. A controlling method for a voltage supply circuit configured to generate a loading current at an output node of the voltage supply circuit, wherein the voltage supply circuit comprises a plurality of inductors coupled to the output node, and the controlling method comprises:

determining the loading current;

when the loading current has a non-zero magnitude, controlling the voltage supply circuit to generate a first driving voltage to drive a first inductor among the plurality of inductors, wherein all other inductors of the plurality of inductors are not driven and the load is not driven until the loading current is at least as high as a loading current for which the first inductor is driven;

when the loading current is greater than a first threshold, controlling the voltage supply circuit to generate a second driving voltage to drive a second inductor among the plurality of inductors, to generate the first driving voltage to drive the first inductor, and to operate the first and second driver circuits in different phases, wherein an inductance value of the first inductor is greater than an inductance value of the second inductor;

when the loading current is greater than a second threshold, controlling the voltage supply circuit to generate a third driving voltage to drive a third inductor among the plurality of inductors, to generate the second driving voltage to drive the second inductor, to generate the first driving voltage to drive the first inductor, and to operate the first, second and third driver circuits in different phases, and wherein the first driver circuit has a same configuration as another driver circuit of the plurality of driver circuits.

8. The controlling method as claimed in claim 7, wherein the inductance value of the first inductor is greater than an inductance value of the third inductor.

9. The controlling method as claimed in claim 8, wherein the inductance values of the second and third inductors are equal.

* * * * *